US005565856A

United States Patent [19]

Takaba et al.

[11] Patent Number: 5,565,856

[45] Date of Patent: Oct. 15, 1996

[54] ABNORMALITY DETECTING DEVICE FOR VEHICLE COMMUNICATION SYSTEM AND METHOD OF USING SAME

[75] Inventors: Katsumi Takaba, Obu; Yukihide Niimi, Chita-gun, both of Japan

[73] Assignee: Nippondenso Co., Ltd., Kariya, Japan

[21] Appl. No.: 317,483

[22] Filed: Oct. 4, 1994

[30] Foreign Application Priority Data

Oct. 5, 1993 [JP] Japan .................................... 5-249473

[51] Int. Cl.[6] .................................................. G01M 15/00

[52] U.S. Cl. ................................ 340/825.16; 340/825.10; 364/424.03; 370/13; 371/20.1

[58] Field of Search ................. 340/825.16; 364/424.03, 364/431.11; 73/116, 117.3; 324/402, 555; 370/13; 371/20.1; 395/183.01, 183.22, 185.01, 185.02, 185.08, 185.09

[56] References Cited

U.S. PATENT DOCUMENTS 4,597,052 6/1986 Matsuda et al. ................... 364/424.03
5,005,129 4/1991 Abe et al. .......................... 364/424.03
5,056,023 10/1991 Abe .................................. 364/424.03

FOREIGN PATENT DOCUMENTS 528091 2/1993 Japan .

*Primary Examiner*—Brian Zimmerman
*Assistant Examiner*—William H. Wilson, Jr.
*Attorney, Agent, or Firm*—Cushman, Darby & Cushman

[57] ABSTRACT

The present invention provides an abnormality detecting device for a vehicle communication system comprising controllers and a diagnosis unit. The controllers store data to be transmitted by means of a communication IC to the diagnosis unit. When data is transmitted to a bus at a first timing, a communication abnormality, if any, around the communication IC is detected in response to the status of data stored in the communication IC at a second timing by a CPU. The CPU determines as an abnormality a case where, after transmission of data from the communication IC to the bus, the data is kept stored in the communication IC. The CPU determines as an abnormality a case where, after transmission of part of data to the communication IC, no data is stored in the communication IC.

11 Claims, 15 Drawing Sheets

ABNORMALITY DETECTING DEVICE FOR VEHICLE COMMUNICATION SYSTEM AND METHOD OF USING SAME

BACKGROUND OF THE INVENTION

1. Field of the Invention

The present invention relates to a vehicle communication system for conducting data communication between controllers. More particularly, the present invention relates to an abnormality detecting device for detecting a communication abnormality in a vehicle communication system, which comprises controllers controlling a vehicle and a diagnosis unit reading out data to be processed in those controllers.

2. Related Art

A vehicle communication system is available that conducts communication, through a bus, of common data between a plurality of controllers performing various controls of a vehicle. In such a system, an abnormality detecting device receives controller answers to transmitted data, and the system determines the presence of an abnormality in the communication system when no answer is received within a predetermined time after data transmission. There is also known the connection of a diagnosis unit for performing communication through a bus with the controllers with a view to reading out the history of the control status of the vehicle by the controllers.

In a vehicle communication system having such controllers as described above, the diagnosis unit is connected to the controllers when reading out vehicle abnormality data stored in the controller by a dealer, for example. This is problematic in that the controller cannot determine the connection of the diagnosis unit, and therefore abnormality detection based on answer back as described above is not applicable.

SUMMARY OF THE INVENTION

In view of the above-mentioned problems, the present invention has as an object the provision of an abnormality detecting device for a vehicle communication system, which permits detection of a communication abnormality in a vehicle communication system having controllers.

To solve this problem, the present invention provides an abnormality detecting device for a vehicle communication system, where the controllers for controlling a vehicle are capable of being externally connected to a diagnosis unit through a bus so that data to be processed by the controller is read out for diagnosing the status of control of the vehicle. The controller includes a buffer device which stores the data to be transmitted to the diagnosis unit and transmits same to the bus at a first timing, and a communication abnormality detecting device which detects a communication abnormality around the buffer device in response to the status of the data stored in the buffer device at a second timing.

Such a communication abnormality detecting device may be provided with a first abnormality determining device which determines as a first abnormality a case where, after the buffer device has transmitted the data to the bus, the data is kept stored in the buffer device.

The above-mentioned communication abnormality detecting device may be provided with a second abnormality determining device which determines as a second abnormality a case where, after part of the data is transmitted to the buffer device, the data is not stored in the buffer device.

BRIEF DESCRIPTION OF THE DRAWINGS

Some preferred embodiments of the present invention are described below. Based on the ensuing description, which includes the specification, figures and appended claims, a person of ordinary skill in the art will become aware of further advantages of the present invention, as well as economies of manufacture and the function of interrelated parts. In the drawings:

FIG. 1(*b*) is a configurational diagram of part of the controller shown in FIG. 1(*a*);

FIG. 5 shows a flowchart illustrating storing a DIAG code corresponding to a particular abnormality into the SRAM region when such an abnormality is detected during abnormality detection shown in FIG. 6 and the like;

FIG. 7 is flowchart illustrating the initial routine executed by the controller only when the ignition switch is turned on;

DETAILED DESCRIPTION OF THE PRESENTLY PREFERRED EXEMPLARY EMBODIMENTS

Some preferred embodiments of the present invention are described in detail below.

Figure 1A:
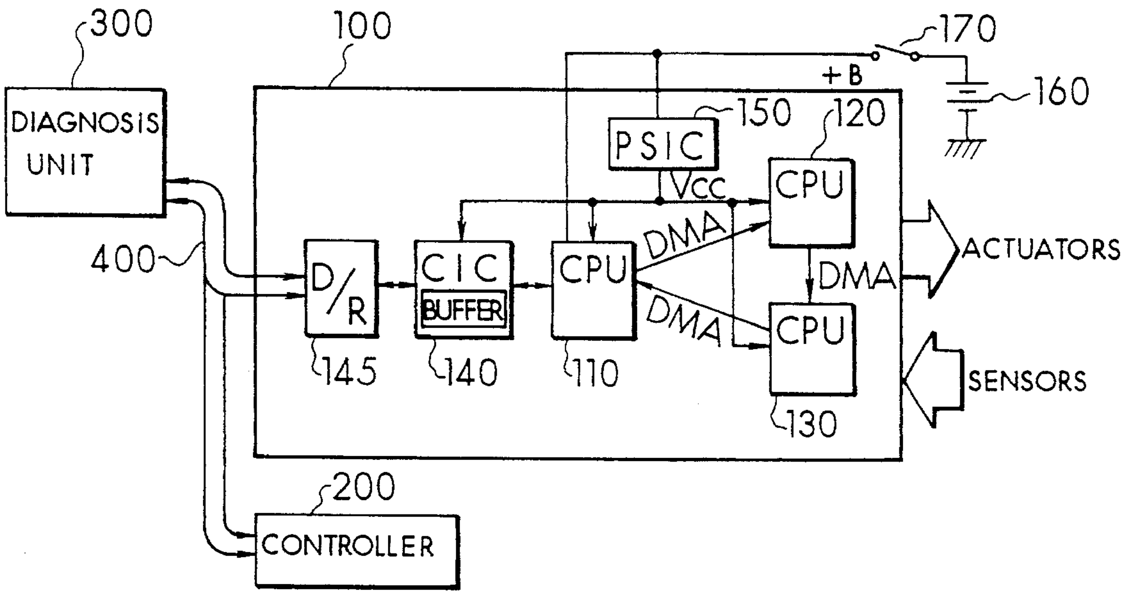
FIG. 1(*a*) is a configurational diagram illustrating a vehicle communication system.
Figure 1B:
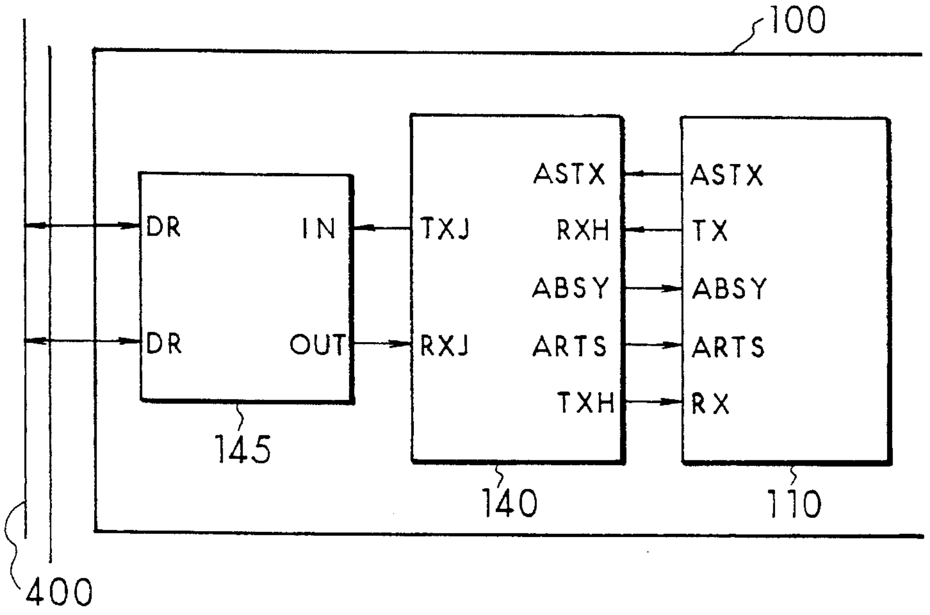

FIG. 1(*a*) is a configurational diagram illustrating a vehicle communication system comprising controllers 100 and 200, a diagnosis unit 300 and other components. The controllers 100 and 200 and the diagnosis unit 300 are connected by a bus 400 to perform various manners of data communication.

A plurality of controllers 100, 200, etc., share various control operations for a vehicle, such as engine control, transmission control, traction control, and brake control. Individual controllers 100 and 200 conduct respective abnormality detecting operations. Communication of sensor signal data, control data and various other forms of data are done via bus 400 between controllers 100 and 200.

Diagnosis unit 300 can be connected, when diagnosis is necessary, through bus 400 to controllers 100 and 200 thus permitting readout of, for example, abnormality detection data processed by the controllers 100 and 200. The detailed construction of controller 100 is described below. A description of controller 200 which has a construction similar to that of the controller 100, is omitted here.

Controller 100 has three CPUs 110, 120, and 130 conducting various control operations. Controller 100 has communication IC 140 and driver/receiver 145 for performing the transmission and reception of various data with controller 200 and diagnosis unit 300 via bus 400. Controller 100 further includes power supply IC (PSIC) 150 which converts battery voltage+B (=12 V, e.g.) supplied by vehicle-mounted battery 160 through ignition switch IGSW 170 into a constant voltage (e.g., =5 V), which is then supplied to CPUs 110, 120 and 130 and communication IC (CIC) 140. Signals from sensors detecting various conditions of the vehicle are input, and control signals are output to various actuators controlling the vehicle on the basis of the sensor signals.

FIG. 1(*b*) is a detailed configuration diagram of CPU 110, communication IC 140, driver/receiver 145, and bus 400. Terminals ASTX and TX of CPU 110 for transmitting data from CPU 110 to communication IC 140 are connected to terminals ASTX and RXH of communication IC 140, respectively. Data issued from terminal TX when terminal ASTX is at LO (low level) is treated as a message. ABSY terminal indicates the status of the buffer in communication IC 140 and is LO when data is contained in the buffer. Terminals ARTS and TXH of communication IC 140 transmit data from communication IC 140 to CPU 110 and are connected to terminals ARTS and RX, respectively, of CPU 110. Data output from TXH when ARTS is LO is treated as one message. TXJ terminal of communication IC 140 transmits data from communication IC 140 to driver/receiver 145, and is connected to IN terminal of driver/receiver 145. OUT terminal of driver/receiver 145 transmits data from driver/receiver 145 to communication IC 140, and is connected to RXJ terminal of communication IC 140. Driver/receiver 145 transmits and receives data to and from bus 400 via two terminals DR.

Figure 2:
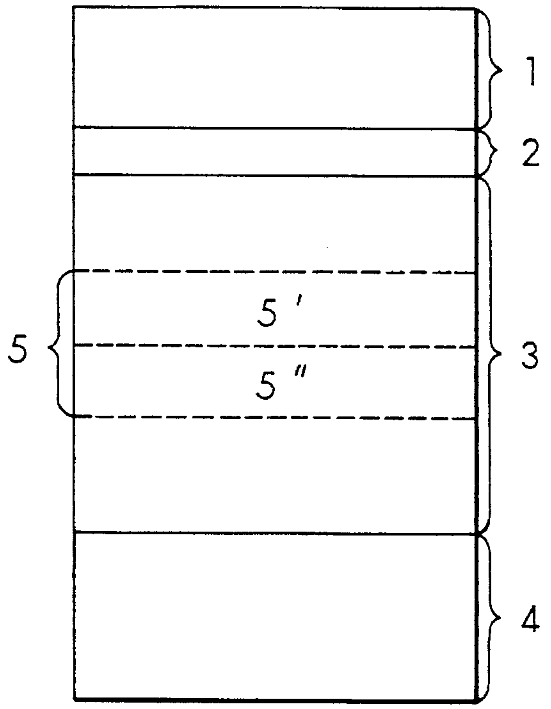
FIG. 2 is a RAM configuration diagram of CPUs 110, 120 and 130 of the controller of the vehicle communication system.

FIG. 2 is a configurational diagram of the RAMs of individual CPUs 110, 120, and 130. Each of CPUs 110, 120, and 130 comprises a one-chip microcomputer having a built-in ROM and RAM. Regions 1 and 3 are RAM regions that store various calculated data. Region 5 in RAM region 3 is a direct memory access region (hereinafter abbreviated as "DMA region"). The region 5' and 5" in the DMA region are a DMA transmitting region and a DMA receiving region, respectively. Data stored in DMA transmitting region 5' is transmitted at prescribed intervals (every 4 msec, for example) to the DMA receiving region 5" of the other CPU. The data received by this DMA receiving region 5" is sent to DMA transmitting region 5' in same DMA region 5. As shown in FIG. 1(*a*), each of CPUs 110, 120, and 130 transmits its data by DMA to the other CPU in a ring manner (in the sequence of: CPU 110→CPU 120→CPU 130→CPU 110, for example). Regions 2 and 4 are standby RAM regions (hereinafter abbreviated as "SRAM region") retaining the contents stored therein, even when ignition switch IGSW 170 is turned off, and store abnormality information of the vehicle and other pieces of information.

Data communication effected between the controllers 100 and 200 and the diagnosis unit 300 is described below.

Figure 3:
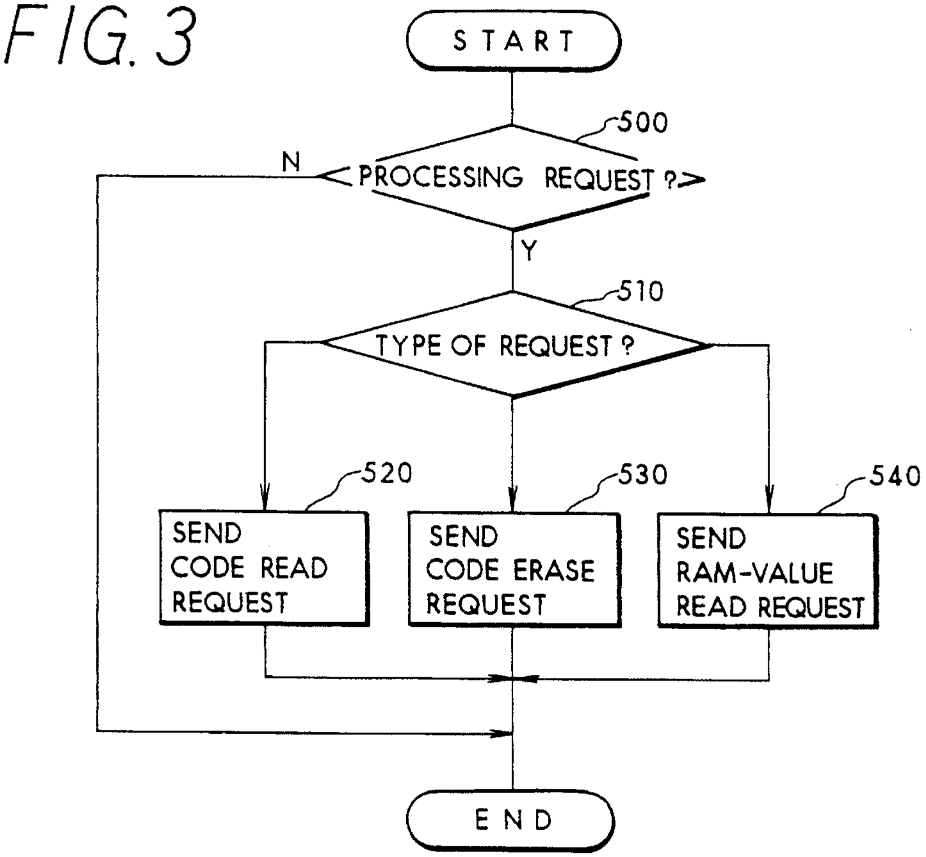
FIG. 3 illustrates a flowchart showing processing according to the diagnosis unit when reading out information stored in the controller.
Figure 4A:
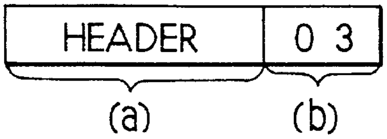
FIGS. 4(*a*)–4(*c*) are representations showing an example of communication at the steps 520, 530 and 540 of FIG. 3.
Figure 4B:
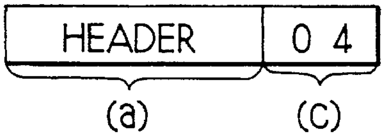
Figure 4C:
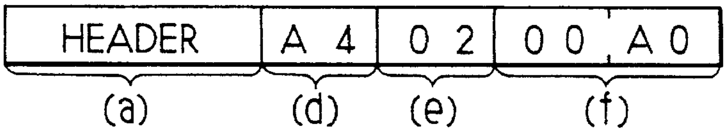

FIG. 3 is a flowchart illustrating processing in the diagnosis unit 300 when reading out various pieces of information stored in controllers 100 and 200 by a diagnosis operator using diagnosis unit 300, which is started at prescribed intervals (the following description covers the case of reading out information stored in the controller 100). FIG. 4 illustrates examples of transmitted data at steps 520 and 540 shown in FIG. 3.

The presence of a processing request from the diagnosis operator is detected at step 500. When there is no processing request, processing ends. When there is a processing request, the type of request is detected at step 510. The types of processing requests include a "code read request" requesting the reading out of a DIAG code which is abnormality detection information as detected by the controller 100, a "code erase request" requesting the erasing of a DIAG code stored in the controller 100, and a "RAM-value read request" requesting the reading out of a desired address data (RAM-value) of the RAMs of individual CPUs 110, 120, and 130.

If the processing request detected at step 510 is a "code read request," the code read request is sent as an output to controller 100 at step 520. The transmitted data has a construction as shown by FIG. 4(*a*), where portion (a) is a header, which is the information for controller 100 to determine whether or not the data transmitted from diagnosing unit 300 is for the controller itself. Portion (b) is data showing a code read request.

When the processing request detected at step 510 is a "code erase request," the code erase request is sent as an output to controller 100 at step 530. The transmitted data has a construction as shown in FIG. 4(*b*), where portion (c) is data showing the code erase request.

When the processing request detected at step 510 is a "RAM-value read request," the RAM-value read request is provided as an output to the controller 100 at the step 540. More specifically, the information is transmitted concerning from which of CPUs 110, 120, and 130 of controller 100 the RAM-value is to be read. The transmitted data has a construction as shown in FIG. 4(*c*), where portion (d) is the data representing the RAM-value read request; the portion (e) is the data indicating covered CPU number; and portion (f) is the data showing the requested address data. As shown in FIGS. 4(*a*)–4(*c*), the number of bytes for a message of transmitted/received data varies with the kind of data.

Abnormality detection and storage of abnormality information at controller 100 are now described.

Figure 5:
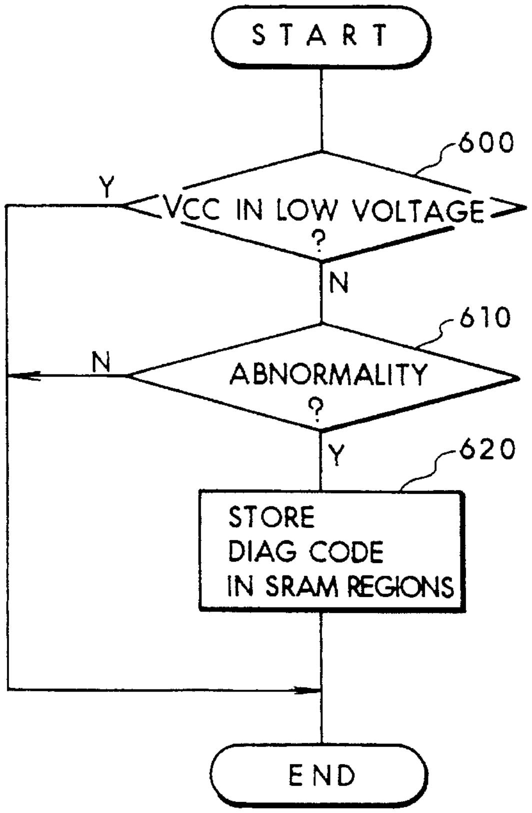
Figure 6:
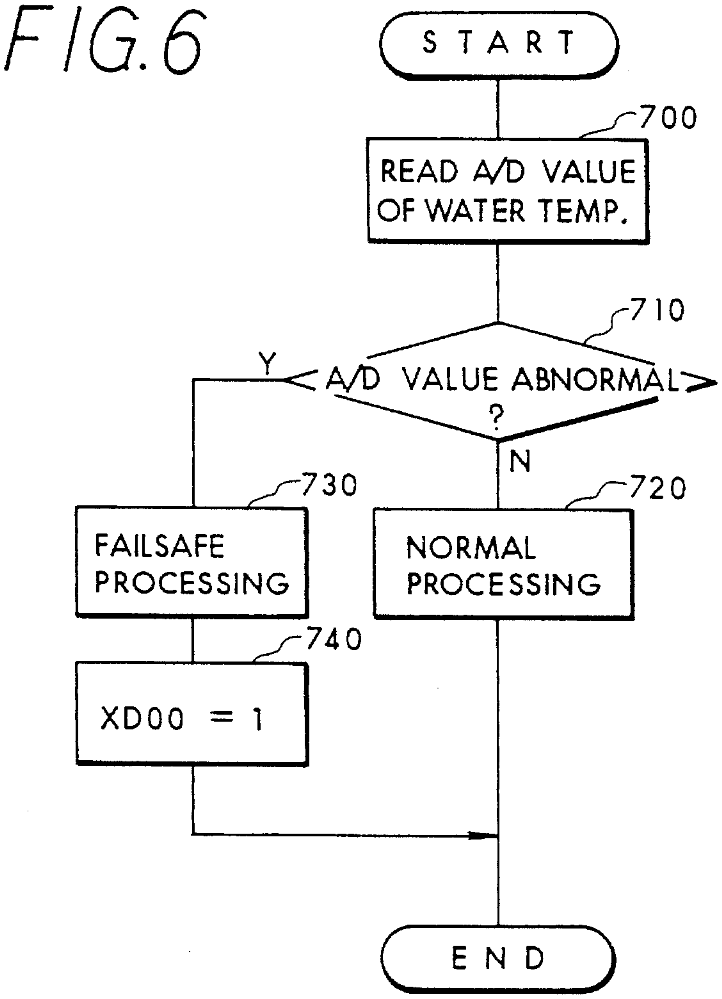
FIG. 6 is a flowchart illustrating abnormality detection of a water temperature sensor.

FIG. 5 is a flowchart illustrating, for example, storage of a DIAG code corresponding to a particular abnormality into the above-mentioned SRAM regions 2 and 4, when the abnormality is detected during abnormality detection, which is depicted in FIG. 6, and this is started at prescribed intervals. This processing is executed in individual CPUs 110, 120, and 130.

Step 600 is to determine whether or not the constant voltage Vcc supplied to CPUs 110, 120, and 130 is in a low-voltage state in which the constant voltage Vcc is lower than the prescribed voltage or battery voltage+B of vehicle-mounted battery 160. When it is determined that the voltage Vcc is at a low-voltage state, a malfunction of the sensor, the actuator or the controller 100 (a malfunction of data update of the SRAM regions 2 and 4) is conceivable. Storage of a DIAG code into the SRAM regions is therefore discontinued, and this processing is terminated. If step 600 results in a determination that it is not a low-voltage state, step 610 determines whether or not the abnormality detection shown in FIG. 6 has detected an abnormality. In FIG. 6, for example, the state with a flag XDOO is detected, in which the flag indicating an abnormality in the water temperature sensor is set in ordinary RAM regions 1 and 3. When no abnormality is detected, this processing comes to an end. When an abnormality is detected, a DIAG code stored in ordinary RAM regions 1 and 3 is copied in SRAM regions 2 and 4 at the step 620 to finish this processing. For example, a flag XDOO indicating an abnormality in the water temperature sensor set in SRAM regions 2 and 4 is set.

FIG. 6 is a flowchart illustrating abnormality detection of the water temperature sensor as a typical example of abnormality detection, and this is started every time a water temperature sensor output value is A/D-converted. Various operations of abnormality detection are shared among CPUs 110, 120, and 130.

First, the A/D-value of the water temperature sensor signal is read in at step 700. Step 710 determines whether the A/D-value thus read is abnormal. This determination is such that, for example, an A/D-value not within a prescribed range is judged to be abnormal. If judged to be normal, processing for a normal value is executed at step 720 (the A/D-value is written in a prescribed RAM region, for example), to finish this processing. When determined to be abnormal, fail safe processing (writing a prescribed value in a prescribed RAM region, for example) is executed at step 730, and a flag XDOO is set at step 740 to finish this processing.

Data communication taking place between controller 100 and diagnosis unit 300 is now described.

Figure 7:
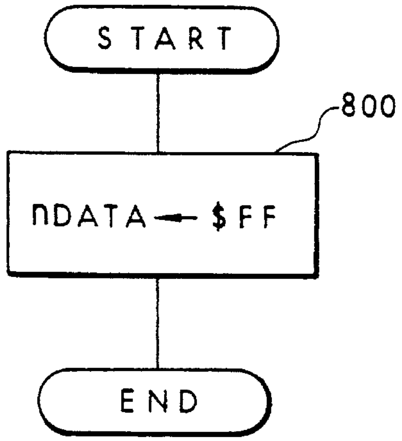

FIG. 7 is a flowchart illustrating an initial routine executed by controller 100 only when IGSW 170 is turned on. Step 800 sets a value not used in ordinary communication previously set to nDATA, i.e., $FF, for example, to finish this processing.

In FIG. 7, nDATA represents the message length of a transmission/receiving buffer RBUF[11] in CPU 110 performing data communication with diagnosis unit 300.

Figure 8A:
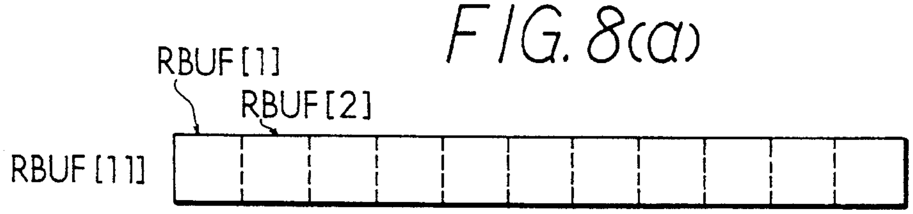
FIGS. 8(*a*) and 8(*b*) are representations illustrating RBUF [11] and nDATA shown in FIG. 7.
Figure 8B:
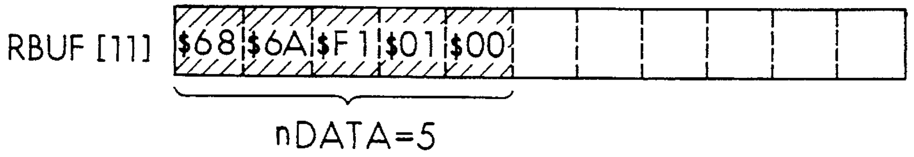

RBUF[11] and nDATA are described below with reference to FIGS. 8(*a*) and 8(*b*). RBUF[11] is an 11-byte buffer as shown in FIG. 8(*a*), and data is written into the individual bytes of RBUF[11] in a sequence of RBUF[1], RBUF[2], . . . . The number of bytes of RBUF[11] written with data, i.e., the message length of RBUF[11] is nDATA. In the case of FIG. 8(*b*), for example, nDATA is set to 5.

Figure 9:
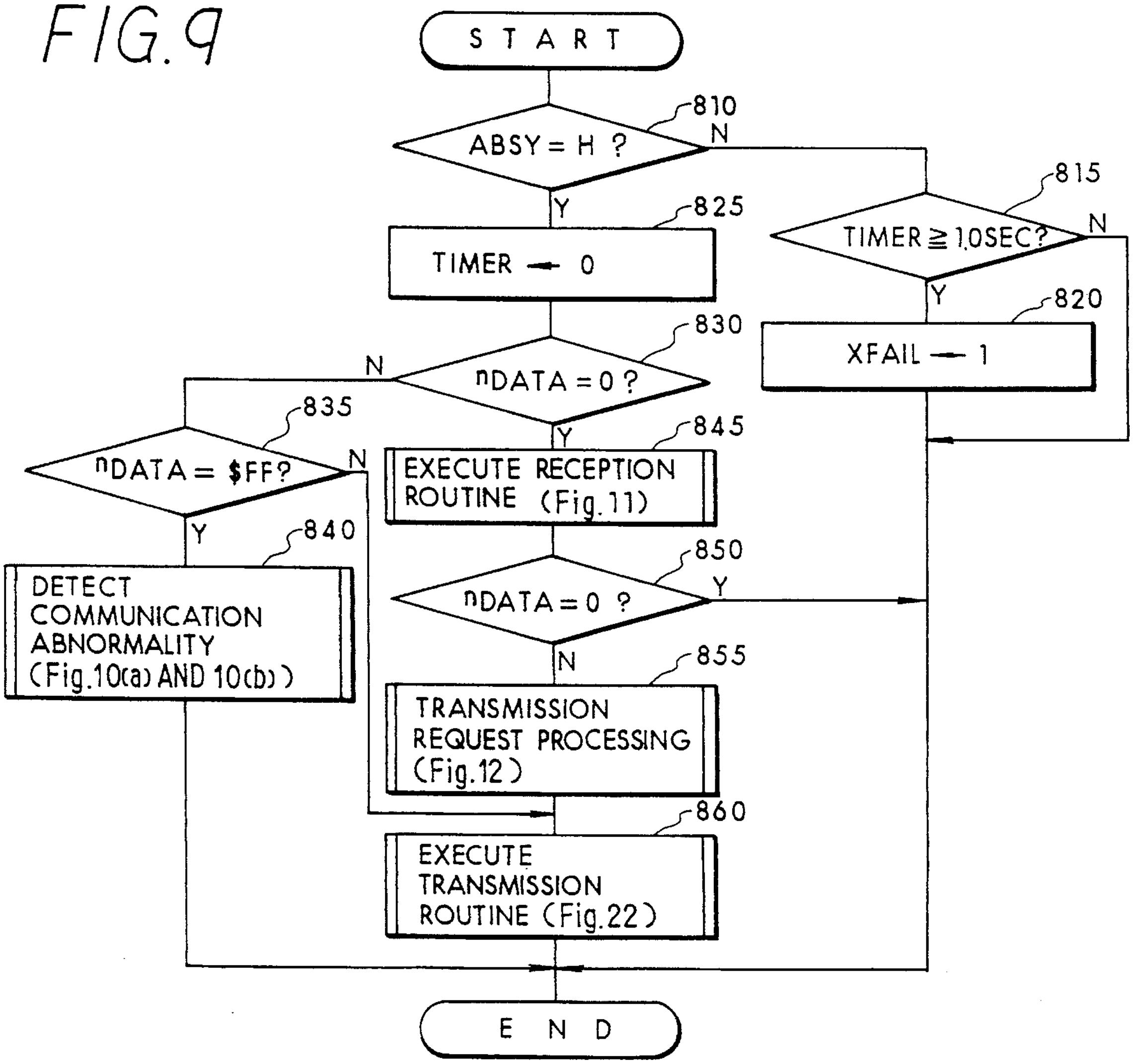
FIG. 9 is a flowchart illustrating transmission and receiving of data between the controller and the diagnosis unit.

FIG. 9 is a flowchart illustrating data transmission and reception between controller 100 and diagnosis unit 300.

Steps 810 to 825 constitute a logic determination as a bus abnormality, a case where bus 400 is not in an idle state for more than a prescribed period of time (1.0 sec, for example). Step 810 detects whether or not ABSY is HI (high level). If ABSY is LO at step 810, TIMER detects whether ABSY has remained LO for 1.0 second or more at the step 815. When TIMER is under 1.0 sec, this processing comes to an end. If TIMER is 1.0 sec or more, i.e., when bus 400 is not in an idle state for more than the prescribed period of time (1.0 sec), a bus abnormality is determined to have taken place, and flag XFAIL indicating a communication abnormality, is set at step 820, to finish this processing.

Figure 23:
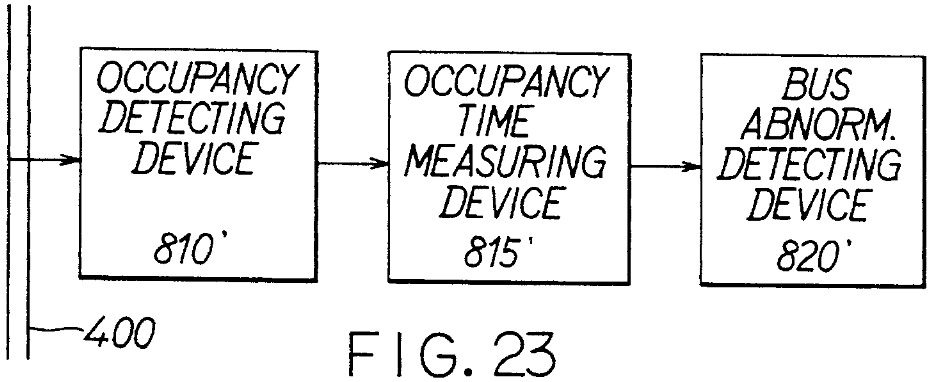
FIG. 23 is a diagram of devices detecting a first communication abnormality according to the present invention.

This operation is alternatively illustrated in FIG. 23, where the occupancy detecting device 810', performing the function of Step 810 described above, detects whether or not ABSY is high; the occupancy time measuring device 815', performing the function of Step 815 described above, detects whether ABSY has been low for a second or more based on the occupancy detecting device 810'; and the bus abnormality detecting device 820', performing the function of Step 820 described above, determines a bus abnormality to have taken place when the occupancy time measuring device 815' detects that ABSY has been low for a second or more.

When ABSY is HI at step 810, on the other hand, TIMER is reset at step 825 before proceeding to step 830. Steps 830 to 860 illustrate transmission and reception of communication data at controller 100. Step 830 detects whether nDATA is 0. When nDATA is not 0, i.e., there is transmitted data, the processing proceeds to step 835. Step 835 detects whether nDATA is $FF. If nDATA is not $FF, the processing proceeds to step 860. When nDATA is $FF, i.e., when it is a timing when IGSW 170 is turned on, the processing proceeds to step 840. A communication abnormality, if any, is detected at step 840 (for details, see FIG. 10 described later), to finish this processing.

When nDATA is 0, i.e., when there is no transmitted data, at step 830, the processing proceeds to step 845. A reception routine for processing the transmitted data from diagnosis unit 300 is executed at step 845 (for details, see FIG. 11 described later). Step 850 detects whether nDATA is 0. If nDATA is 0, i.e., if there is no transmitted data from diagnosis unit 300, this processing is terminated. When nDATA is not 0, i.e., when there is data transmitted from diagnosis unit 300, the transmission request processing is executed at step 855 on the basis of the transmitted data (for details, see FIG. 12 described later), and the processing proceeds to step 860. A transmission routine is executed at step 860 (for details, see FIG. 22 described later) to finish this processing.

Now, the method of detecting a communication abnormality, which forms one of the features of the present invention, is described below.

First, when transmitting data from CPU 110 to communication IC 140, ASTX is set to LO, and data is transmitted to communication IC 140 sequentially from TX. Communication IC 140 stores the data transmitted from CPU 110 sequentially in the buffer. Further, communication IC 140 determines that data received up to the time point when ASTX becomes HI forms one message, and as such, transmits one message in a batch from TXJ to the bus.

Upon occurrence of an abnormality (first abnormality) caused by the bus short-circuiting with the ground, data cannot be transmitted from communication IC 140 to bus 400. ABSY therefore becomes HI after executing data transmission from TXJ. However, because there exists data that cannot be transmitted to the buffer upon ASTX's shut-down, ABSY becomes LO.

When ABSY is LO, as in the case where ABSY is shut down after execution of data transmission by communication IC 140 to bus 400, short-circuiting of bus 400 with the ground is determined as a first abnormality. Upon occurrence of an abnormality (second abnormality) caused by the signal line short-circuiting with the ground between CPU 110 and communication IC 140, no data is transmitted from CPU 110 to communication IC 140. When ABSY is HI upon transmission of data by one byte from CPU 110, short-circuiting of the signal line between CPU 110 and communication IC 140 is determined as a second abnormality.

Figure 10A:
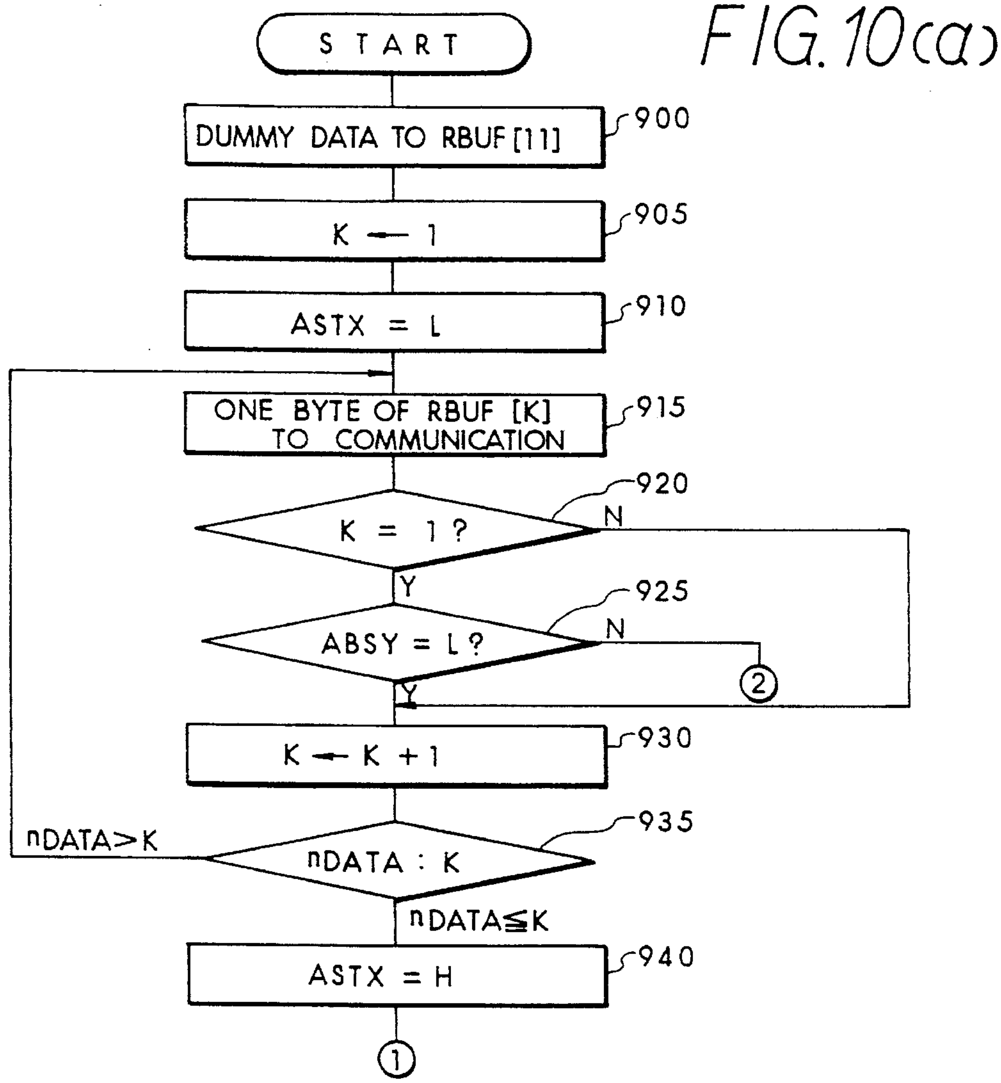
FIGS. 10(*a*) and 10(*b*) are flowcharts illustrating communication abnormality detection at step 840 shown in FIG. 9.
Figure 10B:
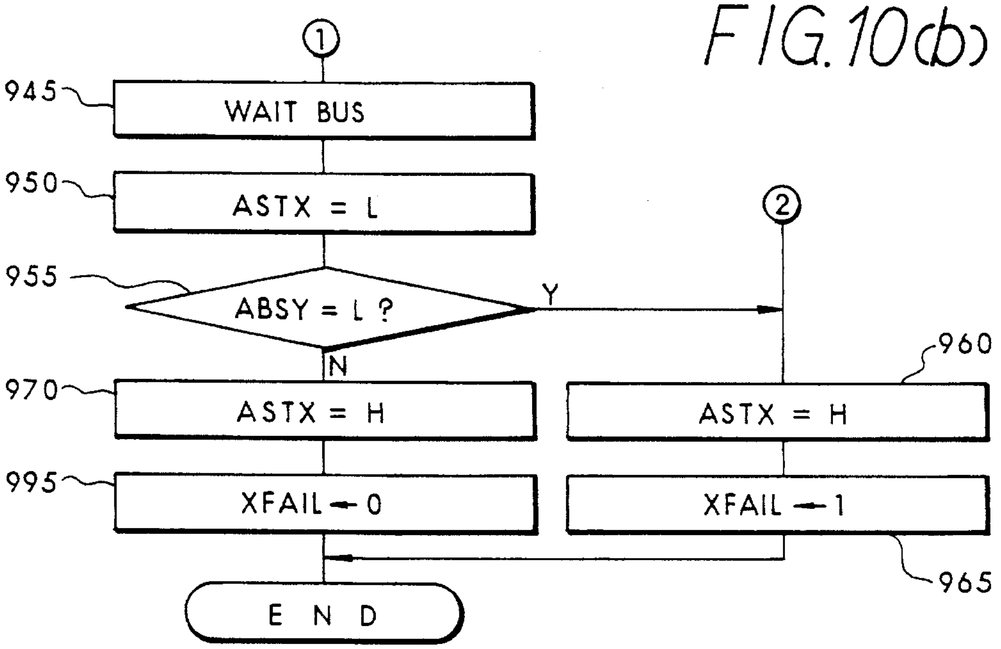

The operation forming another feature of the present invention is described below with reference to FIGS. 10(*a*) and 10(*b*). In FIGS. 10(*a*) and 10(*b*), flowcharts are depicted illustrating communication abnormality detection at the step 840 shown in FIG. 9.

First, the dummy transmitted data for inspection is sent to RBUF[11], nDATA at step 900. In this embodiment, data comprising two bytes is used as the dummy transmitted data, which is composed of a header and a prescribed value. A variable k is set to 1 at step 905. In step 910, ASTX is brought to LO to indicate transfer of the transmitted data to communication IC 140. At step 915, one byte of RBUF[k] is transmitted to communication IC 140.

Step 920 detects whether the variable k is 1. When the variable k is not 1, i.e., when the timing is that the second byte of the dummy transmitted data has just been transferred, the processing proceeds to step 930. When the variable k is 1, i.e., when the timing is that the first byte of the dummy transmitted data has just been transferred, step 925 detects whether ABSY is in the LO state or not. When ABSY is HI, a determination is made that a communication abnormality has occurred (second abnormality determining device), and the processing proceeds to step 960, shown in FIG. 10(*b*). If ABSY is LO, the processing proceeds to step 930. An increment is provided (k←k+1) to the variable k at step 930, and step 935 is executed. At step 935, nDATA is compared with the variable k. When nDATA is larger than the variable k, the processing returns to step 915. If nDATA is not larger than the variable k, the processing proceeds to step 940, and at step 940, ASTX is brought to HI to indicate that transfer of the transmitted data has been completed to communication IC 140. Then, the system continues with step 945 in FIG. 10(*b*).

Step 945 waits for a prescribed period of time so that the transmitted data transferred to communication IC 140 will be transmitted through driver/receiver 145 to bus 400. ASTX is switched down to LO at step 950. Step 955 detects whether ABSY is LO. When ABSY is LO, a communication abnormality (first abnormality determining device) is detected, and the system proceeds to step 960. ASTX is brought up to HI at step 960, and a communication abnormality flag XFAIL is set to 1 at step 965. When ABSY is HI in step 955, no communication abnormality is determined, and processing proceeds to step 970. At step 970, ASTX is switched up to HI, and the communication abnormality flag XFAIL is reset in step 975.

Figure 24:
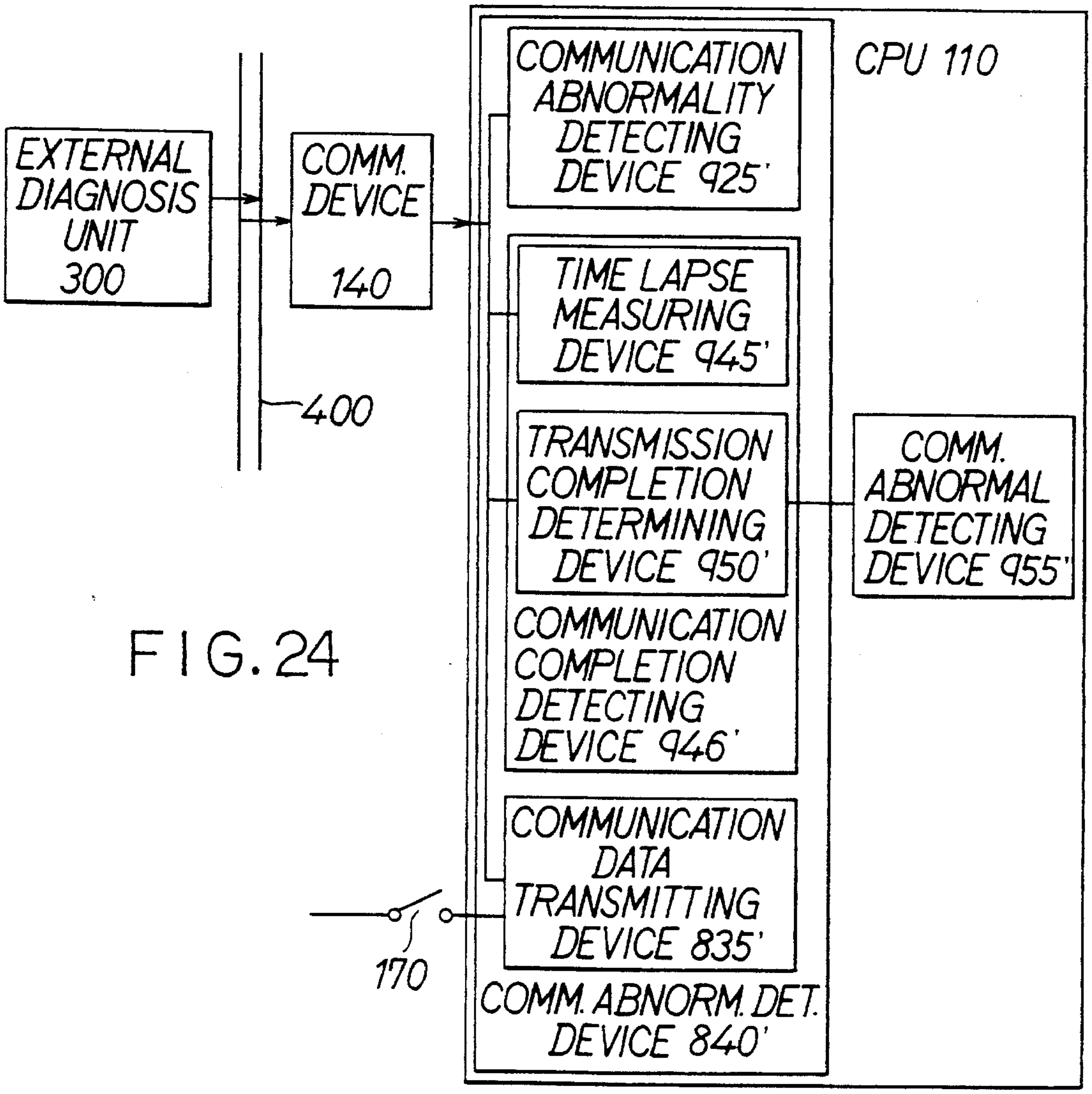
FIG. 24 is a diagram of devices detecting other communication abnormalities according to the present invention.

This operation is alternatively illustrated in FIG. 24, where the communication data transmitting device 835', performing the function of Step 835 described above, transmits dummy communication data for abnormality detection; the communication abnormality detecting device 925', performing the function of Step 925 described above, determines that a communication abnormality has occurred based on the contents of the communication device 140; the time lapse measuring device 945', performing the function of Step 945 described above, waits for a predetermined period of time after passing data to the communication device 140; transmission completion determining device 950', performing the function of Step 950, determining that data transmission has been completed when the time period measured by the time lapse measuring device 945 elapses; communication completion detecting device 946', incorporating the time lapse measuring device 945' and the transmission completion determining device 950', detecting completion of transmission of communication data from the communication device to the bus; the communication abnormality determining device 840', performing the function of Step 840 described above, detecting a communication abnormality in response to status of communication data stored in the communication device 140; and the communication abnormality detecting device 955', performing the function of Step 955 described above, detecting a communication abnormality when the communication data is stored in the communication device after completion of transmission of data.

ABSY is switched to LO at the point when the first byte of data transmitted from CPU 110 is received (when the data has been stored in the buffer of communication IC 140), and is switched to HI when all transmitted data has been transmitted to bus 400 (when the data has become non-existent in the buffer of communication IC 140).

Figure 11:
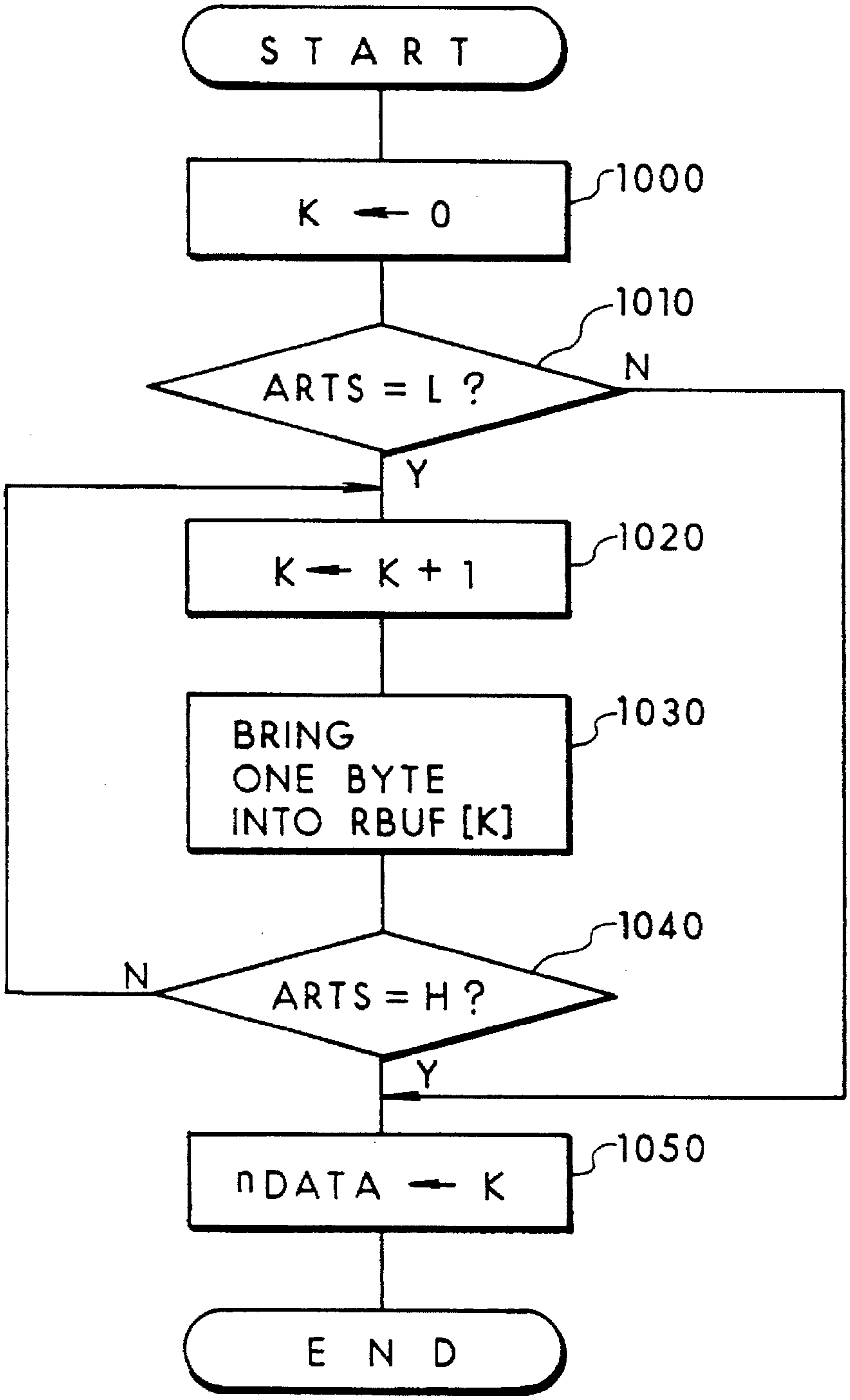
FIG. 11 is a flowchart illustrating processing by the receiving routine at step 845 shown in FIG. 9.

FIG. 11 is a flowchart illustrating the reception routine processing that occurs in step 845 shown in FIG. 9.

First, the variable k for detecting the message length of the received data is set to 0 at step 1000. Step 1010 detects whether ARTS is LO. When ARTS is HI, i.e., when there is no data received from diagnosis unit 300 in communication IC 140, the processing proceeds to step 1050. When ARTS is LO, i.e., when communication IC 140 contains data received from diagnosis unit 300 at step 1010, the received data is set in RBUF[11] at steps 1020 to 1040. Variable k is first incremented by one in step 1020. A byte of received data is brought into RBUF[k] at step 1030.

Step 1040 detects whether ARTS is HI. If ARTS is LO, i.e., if the received data still remains, the processing proceeds to step 1020 and steps 1020 to 1040 are re-executed. When ARTS is HI, i.e., absence of received data, processing continues with step 1050. At step 1050, the variable k is set to nDATA as the message length of the received data to finish this processing.

Figure 12:
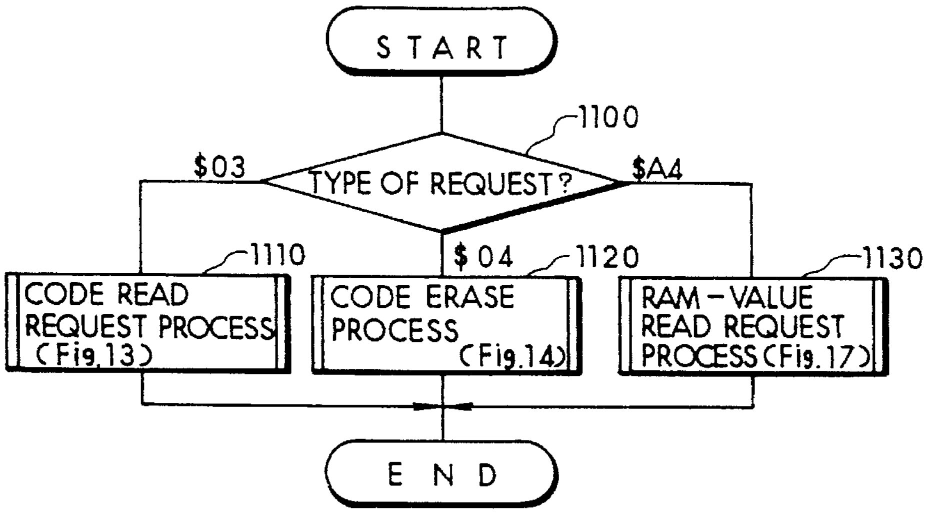
FIG. 12 is a flowchart illustrating response at step 855 shown in FIG. 9.

FIG. 12 is a flowchart illustrating transmission request processing that occurs at step 855 shown in FIG. 9.

First, the type of request from diagnosis unit 300 is detected at step 1100. Since the data transmitted from diagnosis unit 300 has a structure as shown in FIGS. 4(*a*)–4(*c*), it is possible to detect the type of request from the data following the header. When the data following the header is $03, i.e., when code read is requested, the code read request is processed at step 1110 (for details, see FIG. 13 described below), to finish this processing. When the data following the header is $04, i.e., when code erase is requested, the code erase request is processed at the step 1120 (for details, see FIG. 14 described below), to finish this processing. When the data following the header is $A4, i.e., when RAM-value read is requested, the RAM-value read request is processed at the step 1130 (for details, see FIG. 17 described below), to finish this processing.

Figure 13:
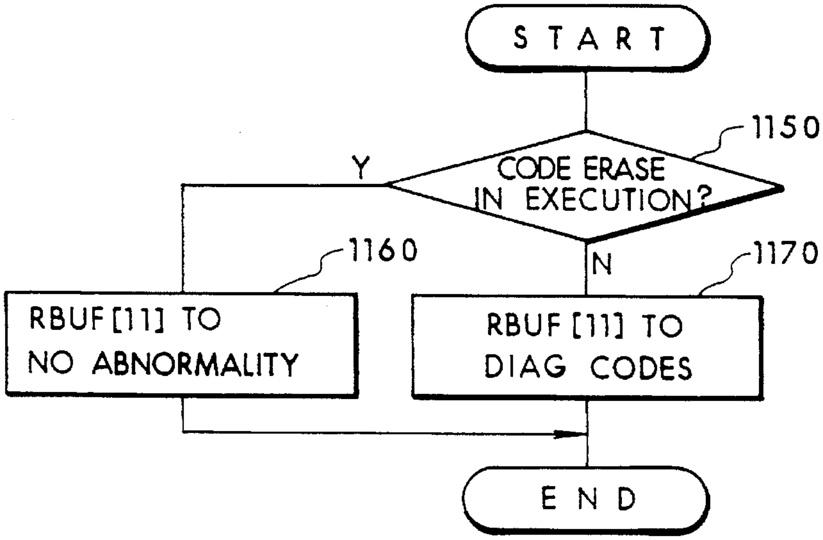
FIG. 13 is a flowchart illustrating processing of code read request at step 1110 shown in FIG. 12.

FIG. 13 is a flowchart illustrating code read request at step 1110 of FIG. 12, which is carried out at prescribed intervals.

First, step 1150 detects whether code erase is being executed. More specifically, this detection is based on a determination as to whether the count value of counter CNT resulting from the processing, shown in FIG. 15, described below is 500 msec or more. If the count value of counter CNT is less than 500 msec, i.e., code erase is in execution, the abnormality information indicates "No Abnormality," i.e., a code corresponding to the abnormality information after code erase is set in RBUF[11] at step 1160, to terminate this processing. When the count value of counter CNT is 500 msec or more, i.e., code erase is not being executed, the DIAG code detected by CPU 110, stored in SRAM regions 2 and 4 and the DIAG code detected by CPUs 120 and 130, stored in DMA region 5, are searched at step 1170, and a code corresponding to the result is set in RBUF[11], to finish this processing.

Figure 14:
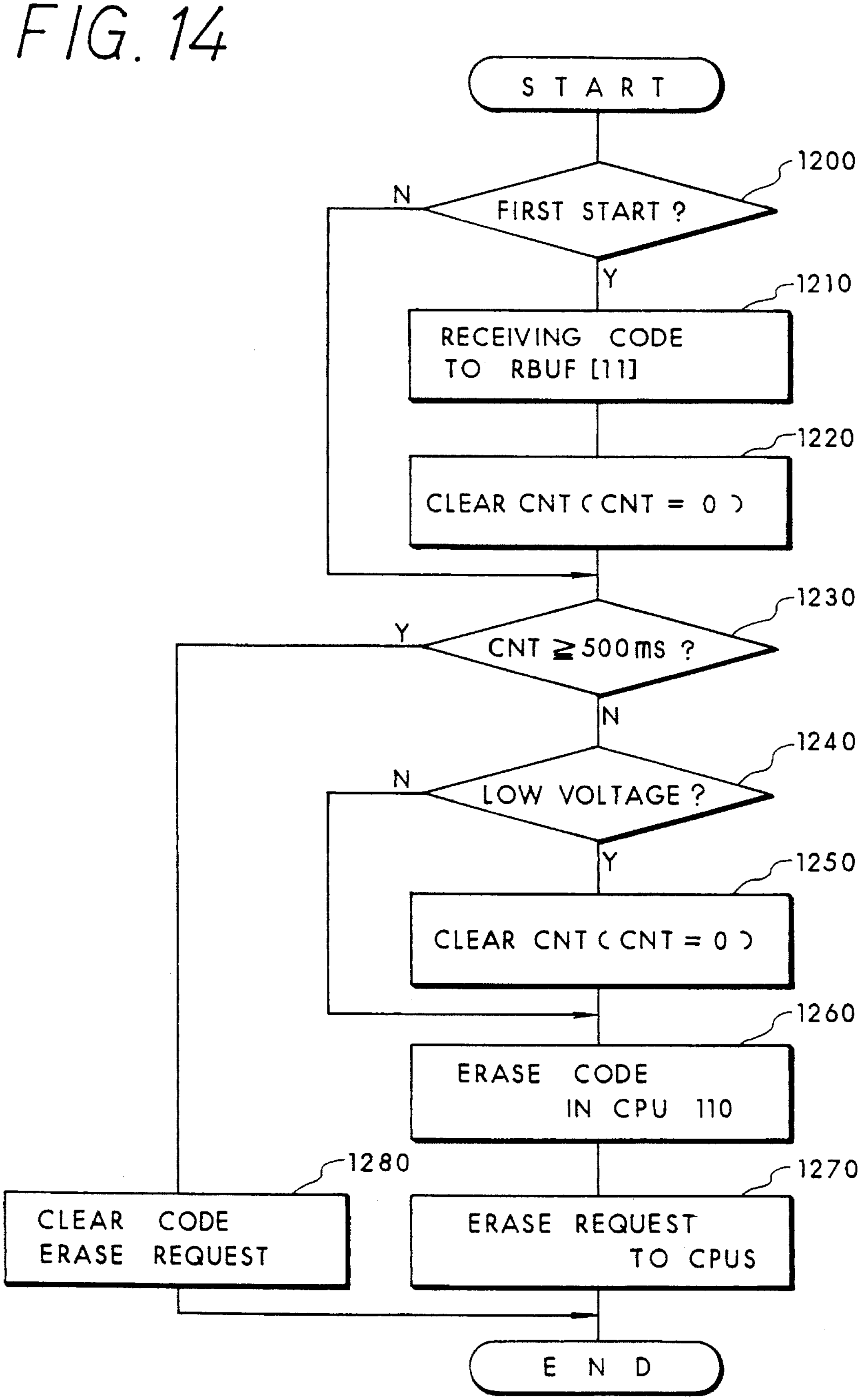
FIG. 14 is a flowchart illustrating processing of code erase request at step 1120 shown in FIG. 12.

FIG. 14 is a flowchart illustrating processing of a code erase request at step 1120 shown in FIG. 12, which is started at prescribed intervals, e.g., every 65 msec, for example.

First, step 1200 detects whether the current starting is the first one after receipt of the code erase request. More specifically, this detection is based on the determination as to whether the data transmitted from the diagnosis unit 300 has a construction as shown in FIG. 4(*b*). If the current starting is not the first one, the processing proceeds to step 1230.

When the current start is determined to be the first one, a receiving code for responding to the effect of having received the code erase request to diagnosis unit 300 is set in RBUF[11] at step 1210, and then processing proceeds to step 1220. At step 1220, the counter CNT for counting the time lapse from the start of code erase is cleared before proceeding to step 1230.

Step 1230 detects whether the count value of the counter CNT is 500 msec or more. When the count value of the counter CNT is less than 500 msec, i.e., when it is determined that code erase is being executed for CPUs 120 or 130, step 1240 detects whether the current state is a low-voltage one. If it is not in a low-voltage state, processing proceeds to step 1260. In a low-voltage state, the counter CNT is cleared at step 1250, before proceeding to step 1260. Since a low-voltage state may cause a malfunction in updating data of SRAM regions 2 and 4 in this embodiment as described above (see FIG. 5), and data update is therefore prohibited, the counter CNT is cleared.

Step 1260 erases the code stored in CPU 110. At step 1270, the code erase request is sent to CPUs 120 and 130, terminating this processing. More specifically, data representing the code erase request is written in the prescribed address of DMA region 5.

When the count value of the counter CNT is 500 msec or more at step 1230, i.e., when it is determined that code erase for the other CPUs 120 and 130 has been completed, the code erase request written in the prescribed address of DMA region 5 is cleared at step 1280, to terminate this processing.

Figure 15:
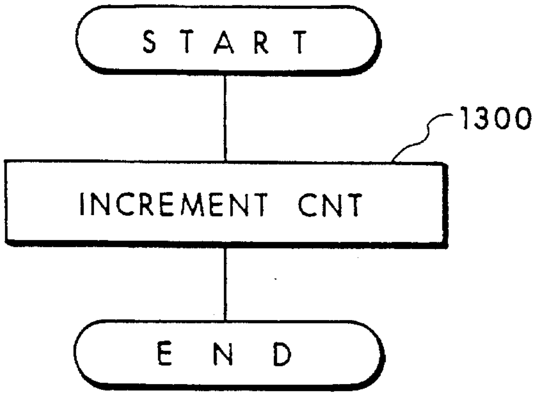
FIG. 15 is a flowchart illustrating processing for making an increment to the counter CNT shown in FIG. 13.

FIG. 15 is a flowchart illustrating processing for incrementing counter CNT at prescribed intervals, e.g., every 65 msec, shown in FIG. 13 described above. Incrementing counter CNT at step 1300 brings this processing to an end.

Figure 16:
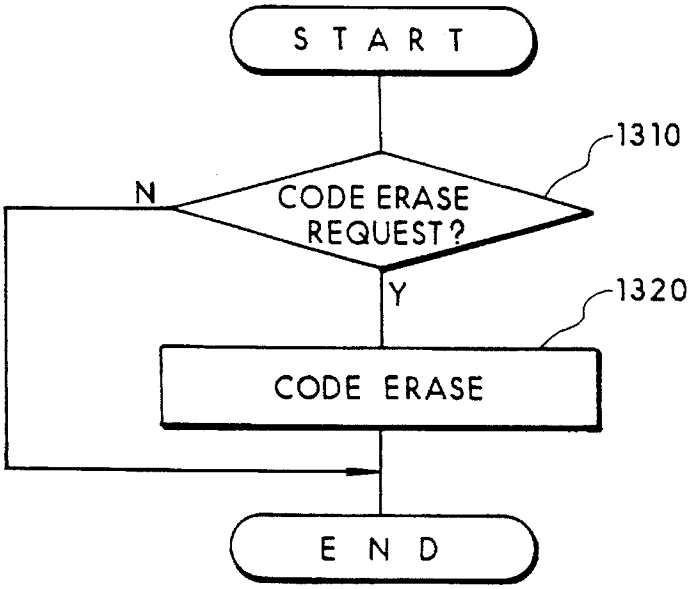
FIG. 16 is a flowchart illustrating processing of code erase performed at the CPUs 120 and 130 in response to a code erase request from the CPU 110.

FIG. 16 is a flowchart illustrating code erase processing performed at CPUs 120 and 130 in response to a code erase request from CPU 110, which is started at prescribed intervals. Presence of a code erase request is detected at step 1310. More specifically, the value of a prescribed address of DMA region transmitted from CPU 110, i.e., the result of steps 1270 and 1280 shown in FIG. 14, is detected. In the absence of a code erase request, this processing is terminated. If there is a code erase request, code erase is executed at step 1320, to finish this processing.

Figure 17:
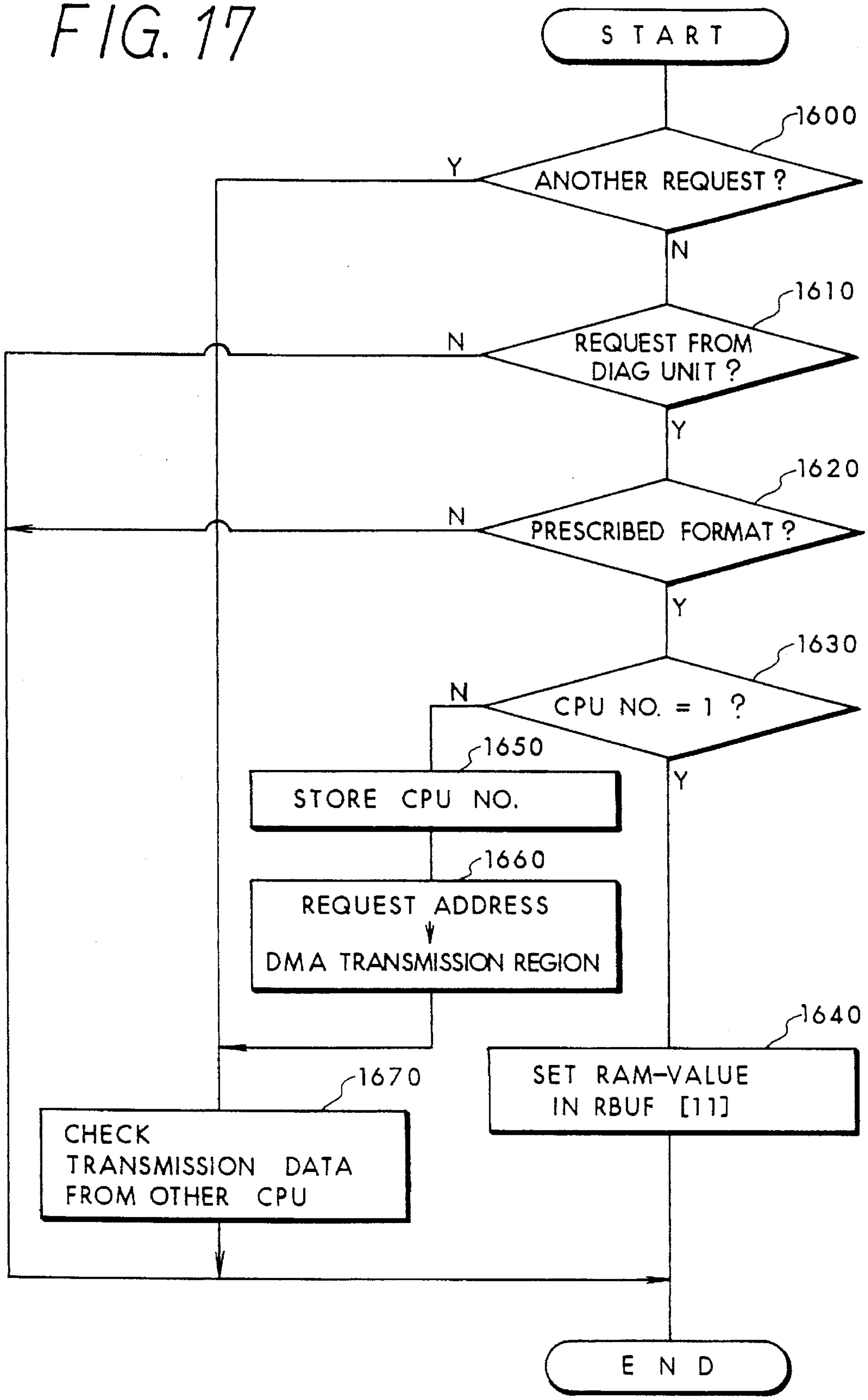
FIG. 17 is a flowchart illustrating processing of a RAM-value read request at step 1130 shown in FIG. 12.

FIG. 17 is a flowchart illustrating processing of a RAM-value read request at step 1130 shown in FIG. 12, which is started at prescribed intervals, e.g., every 16 msec.

First, step 1600 detects whether there is already another RAM-value read request waiting for data input. If data input is expected, processing proceeds to step 1670. When no data input is expected, step 1610 detects whether there has been a RAM-value read request from diagnosis unit 300 at the current start timing. If no request for RAM-value reading at the current start timing, this processing is terminated. When there is a RAM-value read request at the current start timing in step 1610, step 1620 detects whether the number and the requested address value of the CPU covered by the transmitted data of the RAM-value read request are in a prescribed format. If not in a prescribed format, the case is determined to be a transmitted data abnormality from diagnosis unit 300, and processing terminates.

If in a prescribed format, step 1630 detects whether the number of CPU subject to the RAM-value read request is one, which corresponds to CPU 110. When the number of the subject CPUs is one at step 1630, i.e., when the subject CPU is CPU 110, the processing proceeds to step 1640, where the RAM-value of the requested address is set in RBUF[11], to finish this processing.

If it is determined at step 1630 that the number of the covered CPUs is two or three, i.e., that covered CPU is not CPU 110, the RAM-value read request is executed for CPU 120 or 130 at steps 1650 and 1660, before proceeding to step 1670. Step 1670 checks the status of transmission of the RAM-value from CPU 120 or 130 (for details, see FIG. 18 described later).

Figure 18:
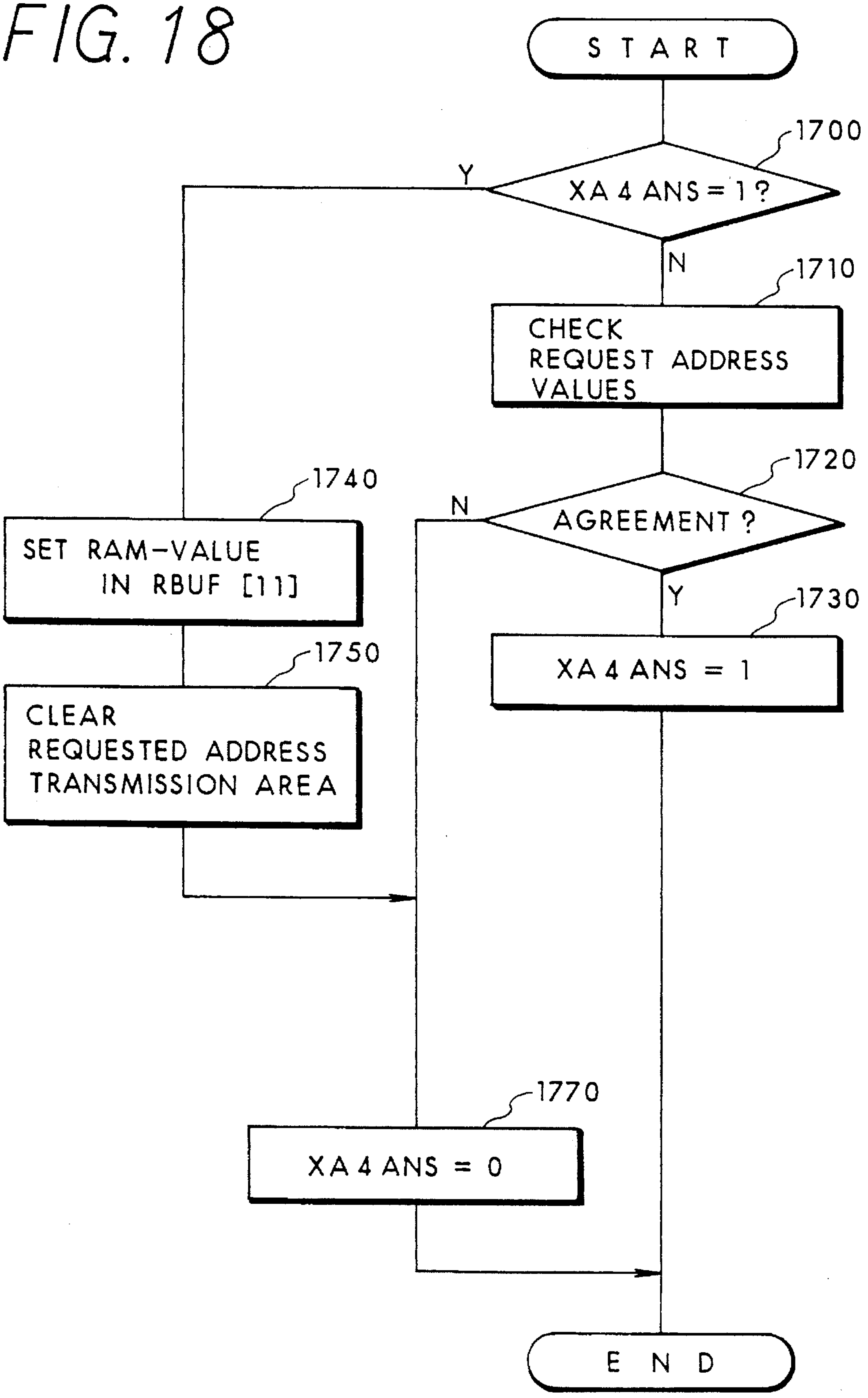
FIG. 18 is a flowchart illustrating checkup of the status of transmission of a RAM-value from the CPUs 120 and 130 at step 1670 shown in FIG. 17.

FIG. 18 is a flowchart illustrating the processing of checking the status of transmission of the RAM-value from the CPUs 120 and 130 at step 1670 of FIG. 17.

Step 1700 detects whether it is the time to respond to diagnosis unit 300. More specifically, if it is a timing, at steps 1730 and 1770, when the address value requested by the CPU 110 to the CPU 120 or 130 agrees with the address value transmitted from the CPU 120 or 130 to the CPU 110, this detection is based on the status of the set flag XA4ANS.

If flag XA4ANS=0, i.e., if it is not the time to respond to diagnosis unit 300, the address value requested at step 1710 is checked with the transmitted address value. Then, step 1720 detects whether the requested address value agrees with the transmitted address value. If not in agreement, the processing proceeds to step 1770. When in agreement, the above-mentioned flag XA4ANS is set to 1 at step 1730 to finish this processing.

When flag XA4ANS=1 at step 1700, i.e., when it is time to respond to diagnosis unit 300 after a predetermined time has lapsed, e.g., 16 msec, after agreement between the requested address value and the transmitted address value, processing proceeds to step 1740. At step 1740, the RAM-value received from the covered CPU is set in RBUF[11]. At step 1750, the requested address transmission area of DMA region 5 is cleared before proceeding to step 1770. At step 1770, the flag XA4ANS is reset, and processing is terminated.

Figure 19:
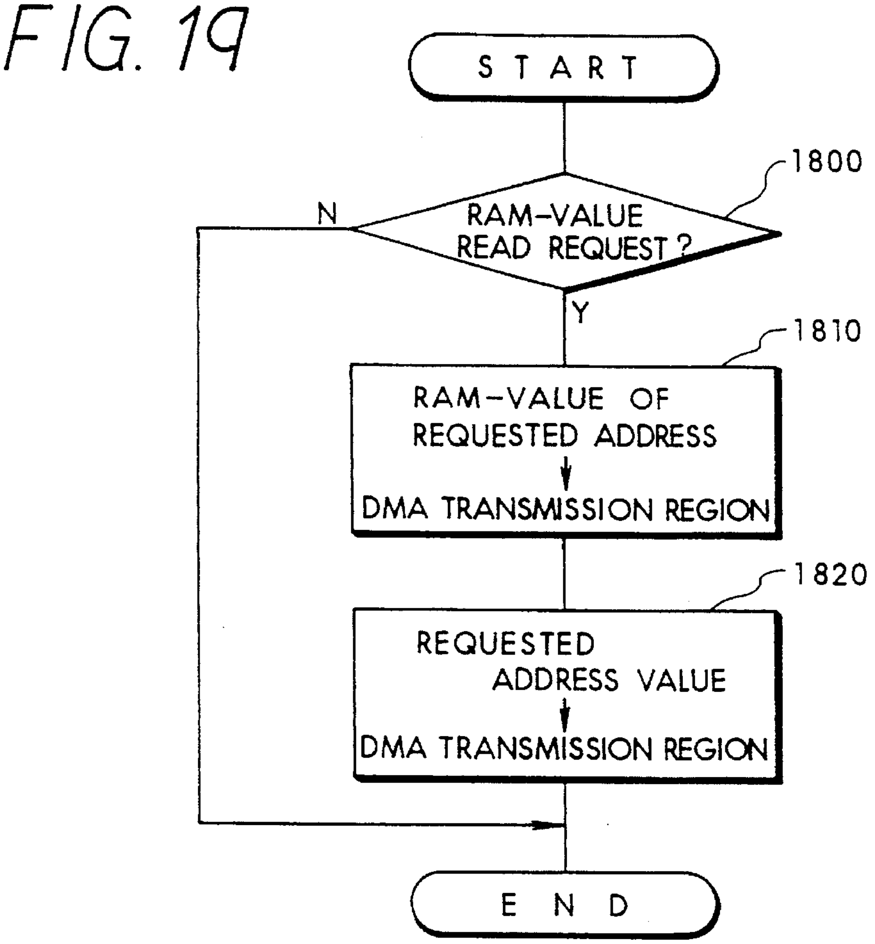
FIG. 19 is a flowchart illustrating processing at CPUs 120 and 130 in response to a RAM-value read request from the CPU 110 at step 540 shown in FIG. 3.

FIG. 19 is a flowchart illustrating processing at CPUs 120 and 130 in response to the RAM-value read request from CPU 110 at step 540 shown in FIG. 3, which is started at prescribed intervals, e.g., every 16 msec. The same processing is executed in CPUs 120 and 130.

First, the presence of a RAM-value read request is detected at step 1800. More specifically, the detection is based on whether the requested address representing the RAM-value read request has been transmitted from CPU 110 to a prescribed address of DMA region 5. In other words, a requested address of $0000 is determined to represent absence of a RAM-value read request. When the requested address is $0000, i.e., there is no RAM-value read request, this processing is terminated. When the requested address is other than $0000 at step 1800, i.e., when there is a RAM-value read request, transmission processing is performed by CPU 110 at steps 1810 and 1820.

At step 1810, the RAM-value of the requested address is written in DMA region 5 shown in FIG. 20, described below, i.e., data H and data L are written therein. At step 1820, the requested address value is written in DMA region 5, i.e., address H and address L are written in, finishing this processing.

Figure 20:
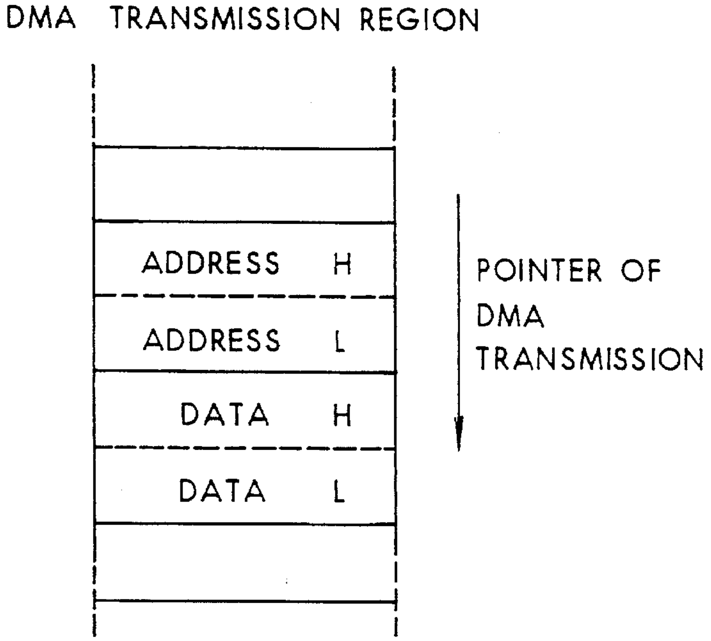
FIG. 20 is a schematic representation of a layout of the DMA region performing transmission to CPU 110 in response to a RAM-value read request.

FIG. 20 illustrates a layout of DMA region 5 performing transmission to CPU 110 in response to a RAM-value read request. In this layout, address H, address L, data H and then data L are transmitted in this sequence to CPU 110 by DMA at prescribed intervals, e.g., every 4 msec. H represents the eight upper bits of the 16-bit data, and L represents the eight lower bits of the 16-bit data.

Now, processing regarding DMA communication with CPUs 110, 120, and 130 is described in the following paragraphs.

Figure 21:
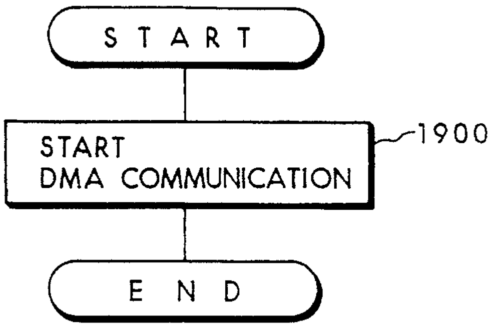
FIG. 21 is a flowchart illustrating processing by software regarding CMA communication executed in CPU.

FIG. 21 is a flowchart illustrating processing by the software concerning DMA communication executed by the individual CPUs 110, 120, and 130, which is started at prescribed intervals, e.g., every 4 msec, for example. DMA communication is started at step 1900, finishing this processing. More specifically, the leading address of DMA region 5 is set as a pointer for DMA communication.

The only portion of actual DMA communication with which the software is associated is starting DMA communication, and after starting, the hardware takes charge of transmitting data in the DMA region 5 sequentially to the other CPUs.

Figure 22:
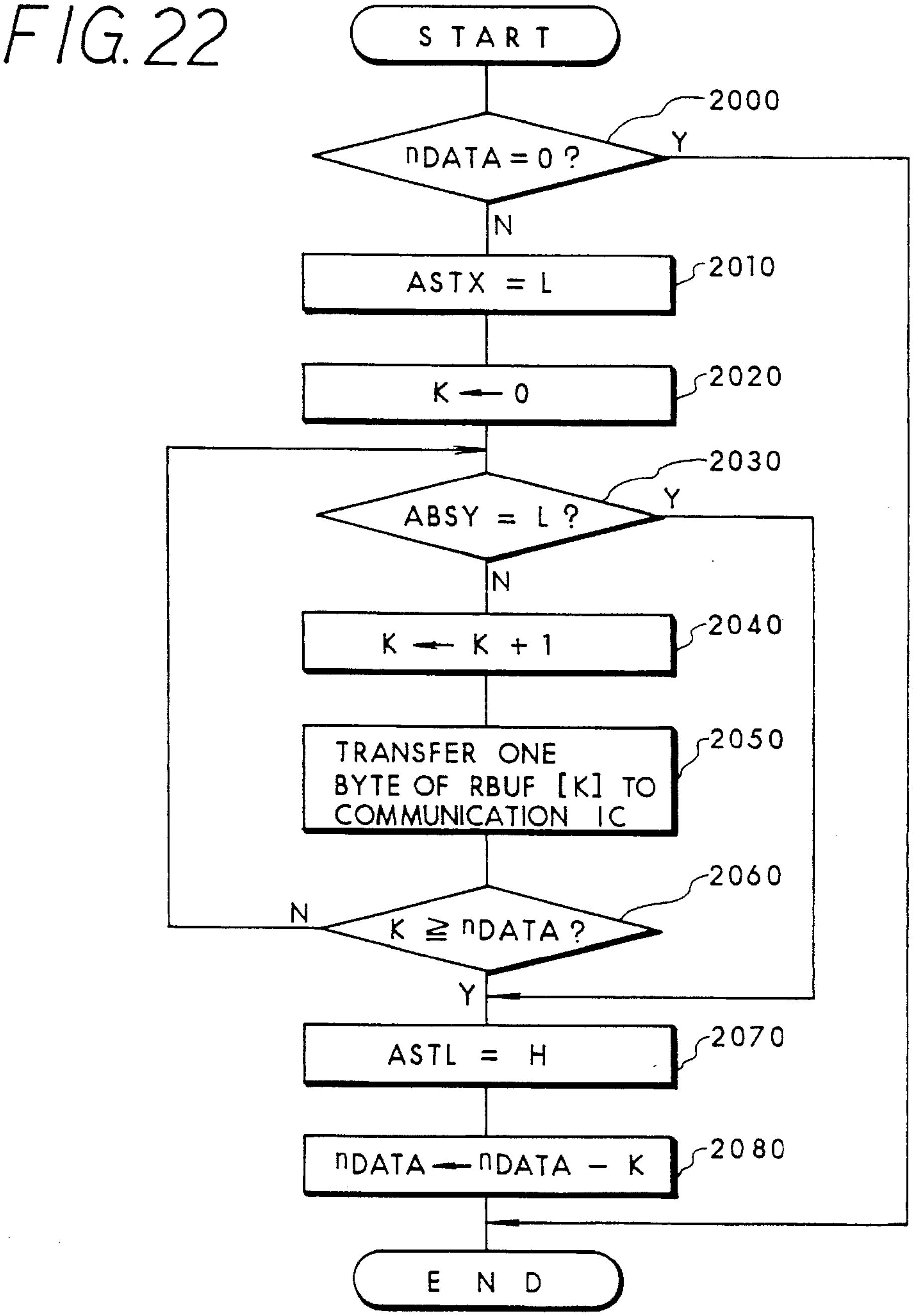
FIG. 22 is a flowchart illustrating processing by a transmission routine at step 860 shown in FIG. 9.

FIG. 22 is a flowchart illustrating transmission routine processing at step 860 shown in FIG. 9.

Step 2000 detects whether nDATA is 0. When nDATA is 0, i.e., when there is no data to be transmitted to diagnosis unit 300, this processing is terminated. When nDATA is not 0, i.e., when there is data to be transmitted to diagnosis unit 300, steps 2010 to 2080 are executed.

At step 2010, ASTX is switched down to LO. At step 2020, the variable k for controlling the number of bytes of transmitted data transferred from RBUF[11] to communication IC 140 at the current control timing is set to 0. Step 2030 detects whether ABSY is LO. If ABSY is LO, the processing proceeds to step 2070. This means that, when ABSY is LO, data to be transmitted to the communication IC 140 cannot be transferred, so that transfer to the communication IC 140 is suspended in the current processing.

When ABSY is HI, processing proceeds to step 2040. An increment (k←k+1) is made to the variable k at step 2040. In step 2050, one byte of the data in RBUF[K] is transferred to communication IC 140. At step 2060, the variable k is compared with nDATA. When the variable k is less than nDATA, i.e., when transfer of the transmitted data in RBUF [11] has not as yet been completed, steps 2030 to 2060 are executed again. When the variable k takes a value of nDATA or more, i.e., when all the transmitted data in RBUF[11] has been transferred to communication IC 140, the processing proceeds to step 2070.

At step 2070, ASTL is brought up to HI. In step 2080, a value calculated by subtracting the variable k from nDATA is set for nDATA. As a result of this processing, transfer of all the data in RBUF[11] brings nDATA to 0. When transfer is discontinued during step 2030, the message length of the non-transferred data is set for nDATA.

In the above-mentioned embodiment, as described above, a communication abnormality is detected in response to the status of the buffer of the communication IC 140 at a prescribed timing after transfer of the transmitted data from CPU 110 to communication IC 140, as shown in FIGS. 10(*a*) and 10(*b*). It is therefore possible to detect a communication abnormality even when diagnosis unit 300 is not connected to controller 100.

When code erase is in execution during code read request as shown in FIG. 13, the proposed practice in the present invention is not to search for an abnormality code from SRAM and transmit the result to diagnosis unit 300, but to transmit data after code erase (without an abnormality code) to diagnosis unit 300. It is therefore possible to prevent, when code erase is in execution upon code read requesting, the data before erase from being transmitted to diagnosis unit 300.

When transmitting a RAM-value from CPU 110 to CPUs 120 and 130 as shown in FIGS. 17 and 18, a RAM-value corresponding to the requested address is transmitted to diagnosis unit 300 upon the lapse of a prescribed period of time, e.g., 16 ms, after agreement between the requested address value from CPU 110 to CPUs 120 and 130 and the transmitted address value from CPUs 120 and 130 to the CPU 110. Transmission of a wrong RAM-value to diagnosis unit 300 can thus be accurately and flawlessly prevented.

What is claimed is:

1. An abnormality detecting method for a vehicle communication system, said system comprising a diagnosis unit, a bus, and a controller for controlling said vehicle via said diagnosis unit, wherein said diagnosis unit conducts, through said bus, readout of data to be processed by said controller for diagnosing a control status of said vehicle;

wherein said method comprises the steps of:

storing data to be transmitted to said diagnosis unit in a buffer of said controller and transmitting said stored data to said bus at a first timing; and detecting a communication abnormality proximate said buffer device in response to a status of said data stored in said buffer device at a second timing after said first timing.

2. An abnormality detecting method for a vehicle communication system as claimed in claim 1, wherein said step of detecting a communication abnormality includes:

determining a abnormality when said data remains stored in said buffer device after a predetermined time from said first timing.

3. An abnormality detecting method for a vehicle communication system as claimed in claim 1, wherein said step of detecting a communication abnormality includes:

determining an abnormality when said buffer device does not store data transmitted thereto.

4. A vehicle controller for connection to an external diagnosis unit via a bus, said vehicle controller comprising:

an occupancy detecting means for detecting the occupancy status of said bus;

an occupancy time measuring device for measuring a period of time during which said bus is continuously occupied; and a bus abnormality detecting device for determining a bus abnormality when said period of time exceeds a predetermined value.

5. A vehicle controller for connection to an external diagnosis unit via a bus, said vehicle controller comprising:

a CPU for processing data communicated to said external diagnosis unit;

a communication device for controlling data communication between said CPU and said external diagnosis unit; and a first communication abnormality detecting device that detects a communication abnormality, in response to a status of communication data stored in said communication device, at a predetermined time.

6. A vehicle controller as claimed in claim 5, wherein said first communication abnormality detecting device includes:

a communication completion detecting device that detects an expected completion of transmission of communication data from said communication device to said bus; and a second communication abnormality determining device for detecting a communication abnormality when said communication data is stored in said communication device after said expected completion of transmission of said communication data.

7. A vehicle controller as claimed in claim 6, wherein said communication completion detecting device includes:

a time lapse measuring device that measures a time lapse from completion of transmission of communication data from said CPU to said communication device; and a transmission completion determining device for determining that transmission of said communication data from said communication device to said bus has been completed, when said time lapse exceeds a predetermined value.

8. A vehicle controller as claimed in claim 5, wherein said first communication abnormality detecting device includes:

a second communication abnormality determining device for detecting a communication abnormality when said communication data is not stored in said communication device after a part of said communication data has been transmitted to said communication device.

9. A vehicle controller as claimed in claim 5, wherein said first communication abnormality detecting device includes:

a communication data transmitting device for communication abnormality detection, with said communication data transmitting device transmitting predetermined dummy communication data for communication abnormality detection from said CPU to said communication device at a timing when an ignition switch of said vehicle is turned on.

10. An abnormality detecting device for a vehicle communication system, for connection to an external diagnosis unit, comprising:

a controller including a CPU and a communication means;

a bus connected to said communication means for data transmission with said external diagnosis unit;

wherein said CPU transmits dummy data to said communication means so that said dummy data is stored in said communication means and transmitted to said external diagnosis unit from said communication means through said bus;

wherein said CPU checks whether said dummy data is kept stored in said communication means after a predetermined time from transmission of said dummy data from said CPU to said communication means; and wherein said CPU determines data abnormality when said dummy data is in said communication means after said predetermined time.

11. A device as claimed in claim 10, wherein said communication means is further for changing its output signal level when data transmission to said bus is completed; and wherein said CPU determines said abnormality by checking said output signal level of said communication means.

* * * * *